(12) United States Patent
Groe et al.

(10) Patent No.: US 7,548,122 B1
(45) Date of Patent: Jun. 16, 2009

(54) PLL WITH SWITCHED PARAMETERS

(75) Inventors: John B. Groe, Poway, CA (US); Paul Lawrence Viani, San Diego, CA (US)

(73) Assignee: Sequoia Communications, San Diego, CA (US)

( * ) Notice: Subject to any disclaimer, the term of this patent is extended or adjusted under 35 U.S.C. 154(b) by 130 days.

(21) Appl. No.: 11/366,992

(22) Filed: Mar. 1, 2006

Related U.S. Application Data

(60) Provisional application No. 60/657,869, filed on Mar. 1, 2005.

(51) Int. Cl.
H03L 7/00 (2006.01)
(52) U.S. Cl. .......................... 331/16; 331/34; 331/175; 331/17
(58) Field of Classification Search ................. 331/16, 331/34, 175, 17
See application file for complete search history.

(56) References Cited

U.S. PATENT DOCUMENTS

| | | | |
|---|---|---|---|
| 4,263,560 A | 4/1981 | Ricker | |
| 4,430,627 A | 2/1984 | Machida | |
| 4,769,588 A | 9/1988 | Panther | |
| 4,816,772 A | 3/1989 | Klotz | |
| 4,926,135 A | 5/1990 | Voorman | |
| 4,965,531 A | 10/1990 | Riley | |
| 5,006,818 A | 4/1991 | Koyama et al. | |
| 5,015,968 A | 5/1991 | Podell et al. | |
| 5,030,923 A | 7/1991 | Arai | |
| 5,289,136 A | 2/1994 | DeVeirman et al. | |
| 5,331,292 A | 7/1994 | Worden et al. | |
| 5,399,990 A | 3/1995 | Miyake | |
| 5,491,450 A | 2/1996 | Helms et al. | |
| 5,508,660 A | 4/1996 | Gersbach et al. | |
| 5,548,594 A | 8/1996 | Nakamura | |
| 5,561,385 A | 10/1996 | Choi | |
| 5,581,216 A | 12/1996 | Ruetz | |
| 5,631,587 A | 5/1997 | Co et al. | |
| 5,648,744 A | 7/1997 | Prakash et al. | |
| 5,677,646 A | 10/1997 | Entrikin | |
| 5,739,730 A | 4/1998 | Rotzoll | |
| 5,767,748 A | 6/1998 | Nakao | |
| 5,818,303 A | 10/1998 | Oishi et al. | |
| 5,834,987 A | 11/1998 | Dent | |
| 5,862,465 A | 1/1999 | Ou | |
| 5,878,101 A | 3/1999 | Aisaka | |
| 5,880,631 A | 3/1999 | Sahota | |
| 5,939,922 A | 8/1999 | Umeda | |
| 5,945,855 A | 8/1999 | Momtaz | |
| 5,949,286 A | 9/1999 | Jones | |
| 5,990,740 A | 11/1999 | Groe | |
| 5,994,959 A | 11/1999 | Ainsworth | |

(Continued)

*Primary Examiner*—Arnold Kinkead
(74) *Attorney, Agent, or Firm*—Cooley Godward Kronish LLP

(57) ABSTRACT

A system and method of operating a phase-locked loop frequency synthesizer is disclosed herein. The disclosed method includes defining a first set of operating parameters applicable to operation of a phase-locked loop of the synthesizer in a first mode and defining a second set of operating parameters applicable to operation of the phase-locked loop in a second mode. A first detection signal is generated so as to initiate transition of the phase-locked loop into the second mode. The method further includes configuring, at least in part in response to the first detection signal, the phase-locked loop to operate in accordance with the second set of operating parameters.

33 Claims, 11 Drawing Sheets

U.S. PATENT DOCUMENTS

| | | |
|---|---|---|
| 5,999,056 A | 12/1999 | Fong |
| 6,011,437 A | 1/2000 | Sutardja et al. |
| 6,018,651 A | 1/2000 | Bruckert et al. |
| 6,031,425 A | 2/2000 | Hasegawa |
| 6,044,124 A | 3/2000 | Monahan et al. |
| 6,052,035 A | 4/2000 | Nolan et al. |
| 6,057,739 A | 5/2000 | Crowley et al. |
| 6,060,935 A | 5/2000 | Shulman |
| 6,091,307 A | 7/2000 | Nelson |
| 6,100,767 A | 8/2000 | Sumi |
| 6,114,920 A | 9/2000 | Moon et al. |
| 6,163,207 A | 12/2000 | Kattner et al. |
| 6,173,011 B1 | 1/2001 | Rey et al. |
| 6,191,956 B1 | 2/2001 | Foreman |
| 6,204,728 B1 | 3/2001 | Hageraats |
| 6,211,737 B1 | 4/2001 | Fong |
| 6,229,374 B1 | 5/2001 | Tammone, Jr. |
| 6,246,289 B1 | 6/2001 | Pisati et al. |
| 6,255,889 B1 | 7/2001 | Branson |
| 6,259,321 B1 | 7/2001 | Song et al. |
| 6,288,609 B1 | 9/2001 | Brueske et al. |
| 6,298,093 B1 | 10/2001 | Genrich |
| 6,333,675 B1 | 12/2001 | Saito |
| 6,370,372 B1 | 4/2002 | Molnar et al. |
| 6,392,487 B1 | 5/2002 | Alexanian |
| 6,404,252 B1 | 6/2002 | Wilsch |
| 6,476,660 B1 | 11/2002 | Visocchi et al. |
| 6,515,553 B1 | 2/2003 | Filiol et al. |
| 6,559,717 B1 | 5/2003 | Lynn et al. |
| 6,560,448 B1 | 5/2003 | Baldwin et al. |
| 6,571,083 B1 | 5/2003 | Powell, II et al. |
| 6,577,190 B2 | 6/2003 | Kim |
| 6,583,671 B2 | 6/2003 | Chatwin |
| 6,583,675 B2 | 6/2003 | Gomez |
| 6,639,474 B2 | 10/2003 | Asikainen et al. |
| 6,664,865 B2 | 12/2003 | Groe et al. |
| 6,683,509 B2 | 1/2004 | Albon et al. |
| 6,693,977 B2 | 2/2004 | Katayama et al. |
| 6,703,887 B2 | 3/2004 | Groe |
| 6,711,391 B1 | 3/2004 | Walker et al. |
| 6,724,235 B2 | 4/2004 | Costa et al. |
| 6,734,736 B2 | 5/2004 | Gharpurey |
| 6,744,319 B2 | 6/2004 | Kim |
| 6,751,272 B1 | 6/2004 | Burns et al. |
| 6,753,738 B1 | 6/2004 | Baird |
| 6,763,228 B2 | 7/2004 | Prentice et al. |
| 6,774,740 B1 | 8/2004 | Groe |
| 6,777,999 B2 | 8/2004 | Kanou et al. |
| 6,781,425 B2 | 8/2004 | Si |
| 6,795,843 B1 | 9/2004 | Groe |
| 6,798,290 B2 | 9/2004 | Groe et al. |
| 6,801,089 B2 | 10/2004 | Costa et al. |
| 6,845,139 B2 | 1/2005 | Gibbons |
| 6,856,205 B1 | 2/2005 | Groe |
| 6,870,411 B2 | 3/2005 | Shibahara et al. |
| 6,917,791 B2 | 7/2005 | Chadwick |
| 6,940,356 B2 * | 9/2005 | McDonald et al. ............ 331/16 |
| 6,943,600 B2 | 9/2005 | Craninckx |
| 6,975,687 B2 | 12/2005 | Jackson et al. |
| 6,985,703 B2 | 1/2006 | Groe et al. |
| 6,990,327 B2 | 1/2006 | Zheng et al. |
| 7,062,248 B2 | 6/2006 | Kuiri |
| 7,065,334 B1 | 6/2006 | Otaka et al. |
| 7,088,979 B1 | 8/2006 | Shenoy et al. |
| 7,123,102 B2 | 10/2006 | Uozumi et al. |
| 7,142,062 B2 | 11/2006 | Vaananen et al. |
| 7,148,764 B2 | 12/2006 | Kasahara et al. |
| 7,171,170 B2 | 1/2007 | Groe et al. |
| 7,215,215 B2 | 5/2007 | Hirano et al. |
| 2002/0071497 A1 | 6/2002 | Bengtsson et al. |
| 2002/0193009 A1 | 12/2002 | Reed |
| 2003/0078016 A1 | 4/2003 | Groe et al. |
| 2003/0092405 A1 | 5/2003 | Groe et al. |
| 2003/0118143 A1 | 6/2003 | Bellaouar et al. |
| 2003/0197564 A1 | 10/2003 | Humphreys et al. |
| 2004/0017862 A1 | 1/2004 | Redman-White |
| 2004/0051590 A1 | 3/2004 | Perrott et al. |
| 2005/0093631 A1 | 5/2005 | Groe |
| 2005/0099232 A1 | 5/2005 | Groe et al. |

* cited by examiner

PLL WITH SWITCHED PARAMETERS

CROSS-REFERENCE TO RELATED APPLICATIONS

This application claims priority under 35 U.S.C. §119(e) to U.S. provisional application Ser. No. 60/657,869, entitled PLL WITH SWITCHED PARAMETERS, filed Mar. 1, 2005, which is hereby incorporated by reference. This application is also related to U.S. Pat. No. 6,856,205, entitled VCO WITH AUTOMATIC CALIBRATION, which is hereby incorporated by reference.

FIELD OF THE INVENTION

The present invention relates generally to phase locked loops used as frequency synthesizers, and more particularly, to a system and method for switching the phase locked loop's operating parameters to reduce acquisition time.

BACKGROUND OF THE INVENTION

More and more communication systems support multiple standards and protocols. These systems rely on compressed operating modes that divide timing frames into sub periods and assign these periods to different protocols. The sub periods allow probing and setting up of new communication links. These require an advanced radio transceiver and, more often than not, duplicate frequency synthesizers to support fast switching.

Frequency synthesizers based on phase-locked loops (PLL) use a feedback loop to create an agile, low-noise signal. The feedback loop helps to minimize noise in track mode but tends to increase the switching time in acquisition mode, making it difficult to optimize the phase-locked loop's overall performance. As such, it would therefore be advantageous to adjust the parameters associated with the phase-locked loop and optimize them according to its mode of operation.

SUMMARY OF THE INVENTION

The present invention advantageously enables the switching and settling time of a phase-locked loop, thereby optimizing its performance for a variety of applications.

In one aspect the invention relates to an apparatus for configuring operational parameters of a phase-locked loop. The apparatus includes a mode detection circuit for generating a detection signal to switch the phase-locked loop from a first mode to a second mode of operation. The apparatus also includes a parameter-switching network that operates to change certain circuit values from first to second states.

In another aspect the invention pertains to a phase-locked loop frequency synthesizer which includes a phase-locked loop disposed to function in a first mode and in a second mode. The synthesizer also includes a mode detection circuit for generating a first detection signal to initiate transition of the phase-locked loop from the first mode to the second mode. A switching network operates to change, at least in part in response to the first detection signal, values of one or more operating parameters of the phase-locked loop.

The present invention also generally relates to a method of operating a phase-locked loop frequency synthesizer. The method includes defining a first set of operating parameters applicable to operation of a phase-locked loop of the synthesizer in a first mode and defining a second set of operating parameters applicable to operation of the phase-locked loop in a second mode. A first detection signal is generated so as to initiate transition of the phase-locked loop into the second mode. The method further includes configuring, at least in part in response to the first detection signal, the phase-locked loop to operate in accordance with the second set of operating parameters.

Another aspect of the invention is directed to an apparatus for configuring operational parameters of a phase locked loop. The apparatus includes a mode detection circuit for generating a first detection signal to transition the phase-locked loop from a first operative mode to a second operative mode. A parameter switching network is operative to switch, at least in part in response to the first detection signal, values of one or more operating parameters of the phase-locked loop from a first state to a second state.

In yet another aspect the present invention pertains to a phase-locked loop module which includes a voltage-controlled oscillator for generating an output signal of a frequency determined by a control voltage. A divider circuit divides the output signal to produce a frequency-divided signal. The module also includes a phase/frequency detector disposed to compare phases between an input reference signal and the frequency-divided signal and to produce a first phase error signal and a second phase error signal. A charge pump circuit produces a charge pump signal in response to the first phase error signal and the second phase error signal. A loop filter produces the control voltage in response to the charge pump signal wherein the loop filter and the charge pump circuit are characterized by one or more operating parameters. The module further includes a parameter switching arrangement for changing values of the one or more operating parameters subsequent to transition of the phase-locked loop from a first operative mode to a second operative mode.

An additional aspect of the invention is directed to a phase-locked loop frequency synthesizer including a phase-locked loop disposed to function in a first operative mode and in a second operative mode. A parameter switching arrangement switches values of one or more operating parameters of the phase-locked loop from a first state to a second state subsequent to transition of the phase-locked loop from the first operative mode into the second operative mode.

BRIEF DESCRIPTION OF THE DRAWINGS

For a better understanding of the nature of the features of the invention, reference should be made to the following detailed description taken in conjunction with the accompanying drawings, in which.

DETAILED DESCRIPTION OF EMBODIMENTS OF THE INVENTION

Figure 1:
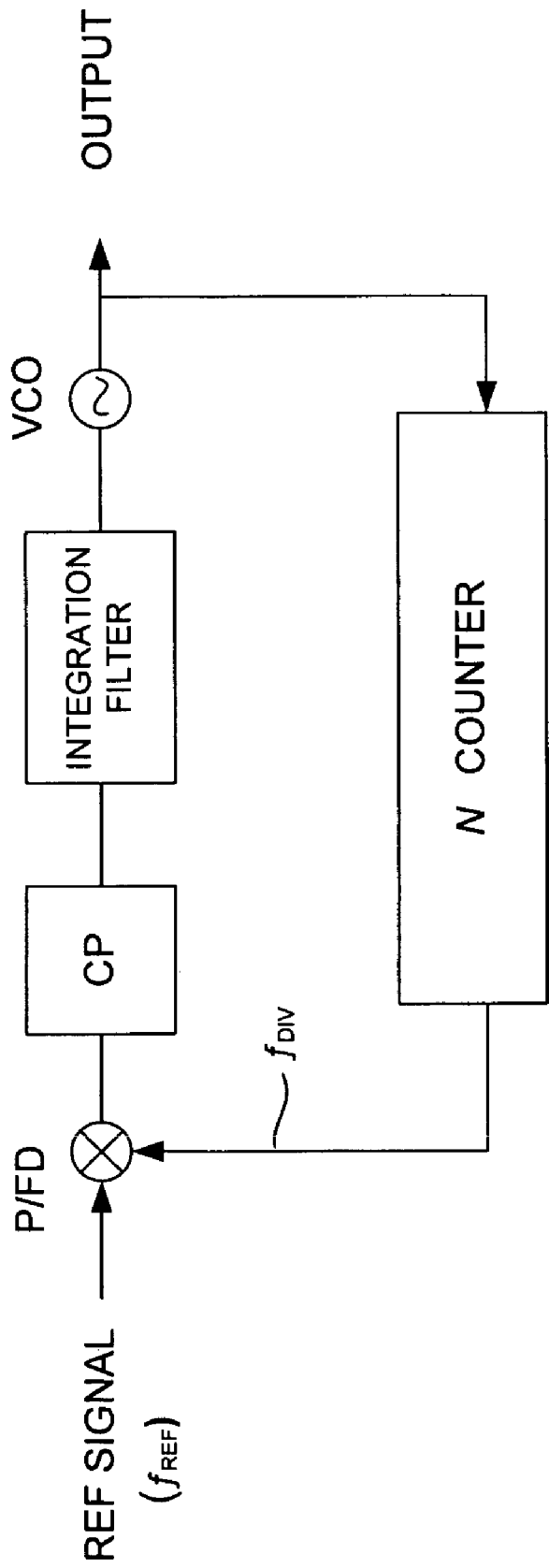
FIG. 1 shows a diagram of a standard phase-locked loop.

A conventional phase-locked loop (PLL) used to synthesize signals at radio frequencies is shown in FIG. 1. It consists of a voltage-controlled oscillator (VCO), N counter, phase/frequency detector (P/FD), charge pump (CP), and integration filter.

The phase-locked loop incorporates feedback that minimizes the phase difference between a very accurate reference signal and the output signal. It operates to generate an output signal at a frequency given by $$f_{VCO} = Nf_{REF}$$

where $f_{vco}$ is the frequency of the output signal produced by the VCO, N is the value of the feedback counter, and $f_{REF}$ is the frequency of the reference signal.

Figure 2:
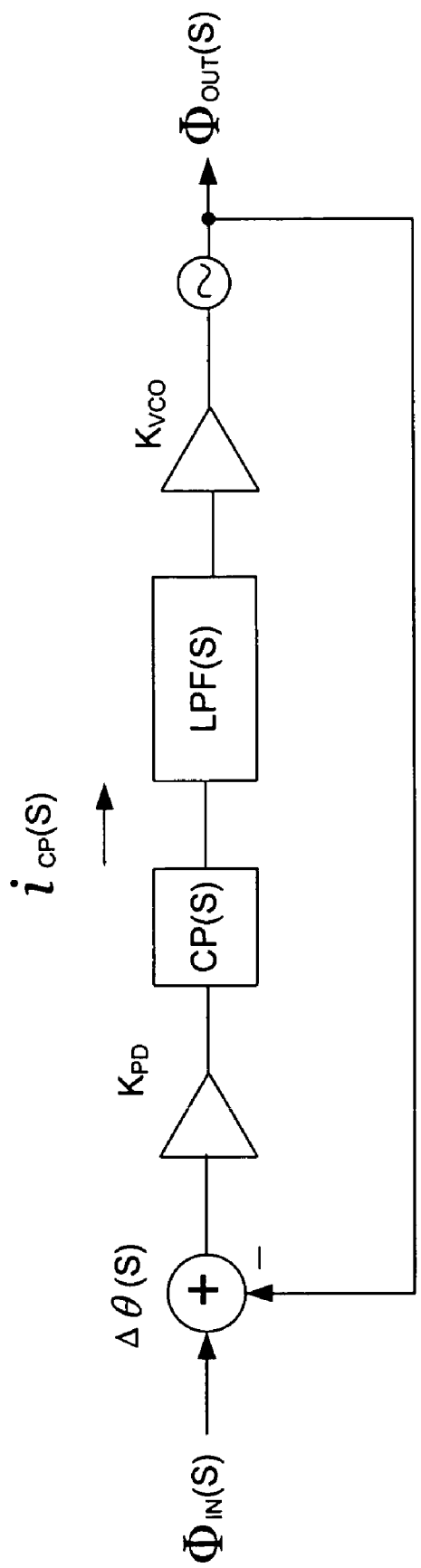
FIG. 2 shows a mathematical model of the PLL.

A mathematical model of the PLL is shown in FIG. 2. The voltage-controlled oscillator produces an output signal at a frequency set by the control voltage $v_{ctrl}$ according to $$v_{out}(t) = A_c \cos(\omega_{free} t + K_{vco} \int v_{ctrl}(t) dt)$$

where $\omega_{free}$ is the free-running frequency of the oscillator and $K_{vco}$ is its associated gain.

The gain $K_{vco}$ describes the relationship between the excess phase of the carrier $\Phi_{out}(s)$ and the control voltage $v_{ctrl}$ $$\frac{\Phi_{out}(s)}{v_{ctrl}(s)} = \frac{K_{vco}}{s}$$

where $K_{vco}$ is in rads/V. The N counter simply divides the output phase $\Phi_{out}(s)$ by N.

Figure 3:
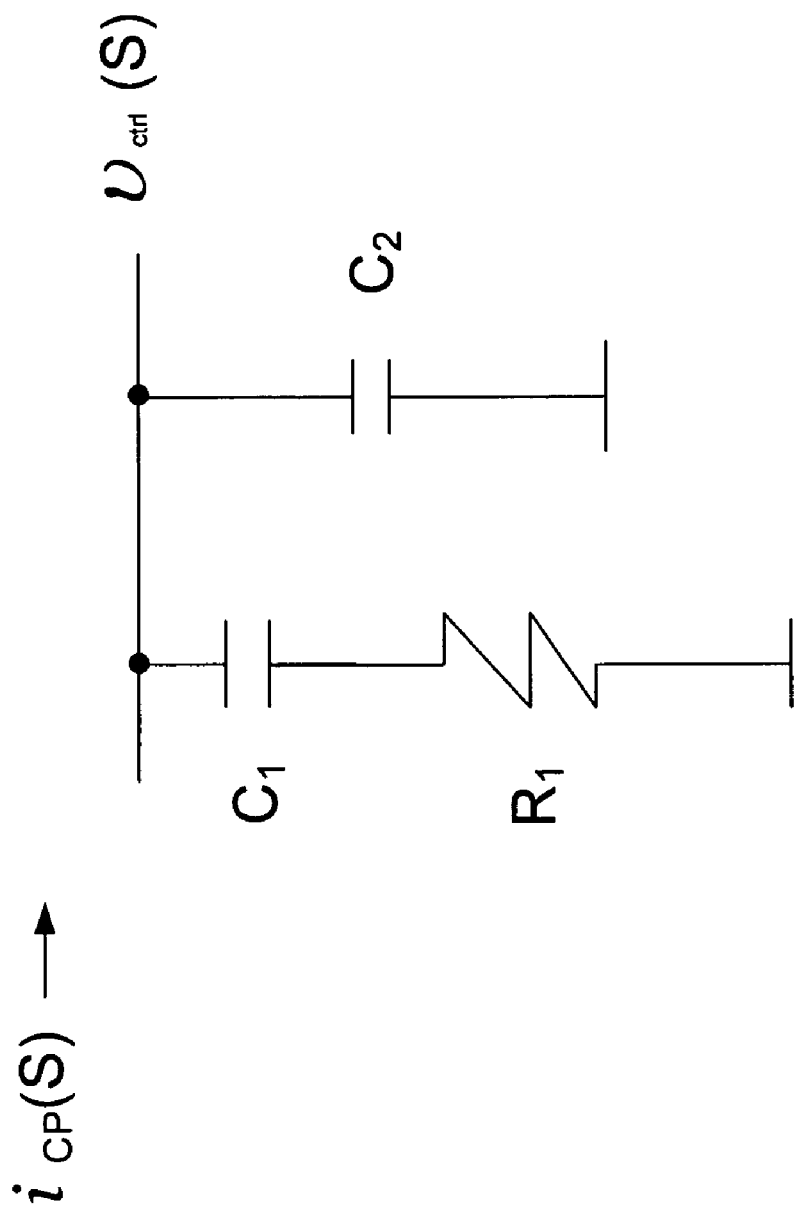
FIG. 3 shows a diagram of a passive low pass filter or integration filter.

When the phase-locked loop is locked, the phase detector and charge pump circuits generate an output signal $i_{CP}(s)$ that is proportional to the phase difference $\Delta\theta$ between its two input signals (the reference signal REF and the divider output signal DIV). The signal $i_{CP}(s)$ shifts positive to advance the VCO frequency and phase while it shifts negative to slow the VCO signal. The output signal $i_{CP}(s)$ can therefore be expressed as $$i_{CP}(s) = K_{pd} \frac{\Delta\theta(S)}{2\pi}$$

where $K_{pd}$ is in A/radians and $\Delta\theta$ is in radians. A simple integration filter, consisting of resistor $R_1$ and capacitors $C_1$-$C_2$ as shown in FIG. 3, transforms the output signal $i_{CP}(s)$ to the control voltage $v_{ctrl}$ as follows $$v_{ctrl}(s) = i_{out}(s) \left( \frac{sR_1C_1 + 1}{s^2 R_1 C_1 C_2 + s(C_1 + C_2)} \right)$$

where a zero (at $1/R_1C_1$) has been added to stabilize the second order system and the capacitor $C_2$ has been included to reduce any ripple on the output voltage. Combining the above relations yields the composite open-loop transfer function $$GH(s) = K_{PD} K_{VCO} \frac{1}{s} \left( \frac{sR_1 C_1 + 1}{sR_1 C_1 C_2 + C_1 + C_2} \right)$$

which has two poles at the origin (due to the voltage-controlled oscillator and the integration filter). This system is referred to as a type II phase-locked loop.

Figure 4:
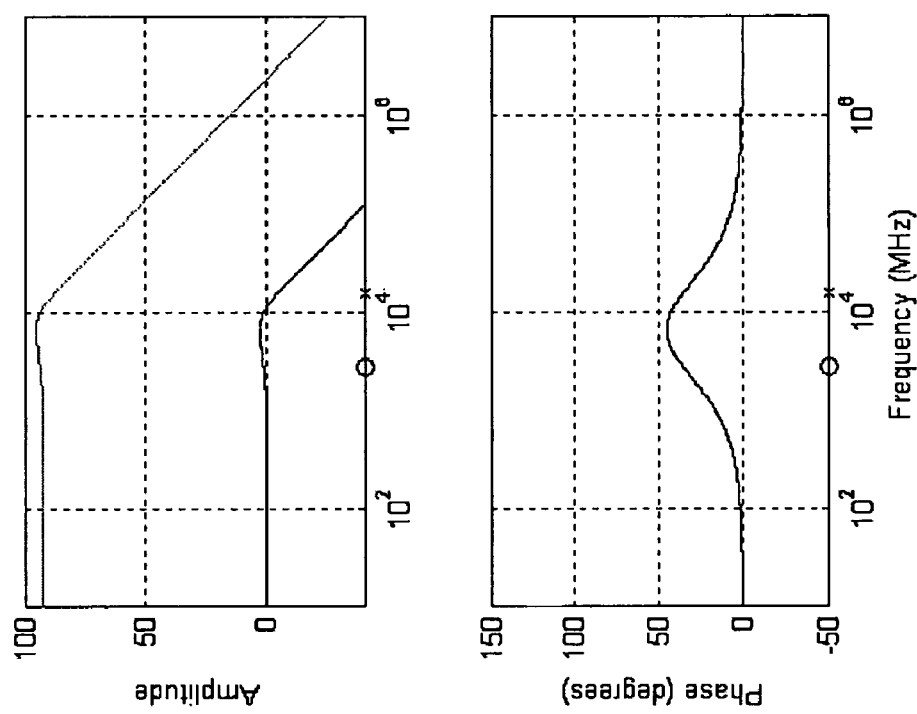
FIG. 4 illustrates the PLL's open-loop transfer function.

The open-loop transfer function GH(s) is used to analyze the stability of the feedback loop. Its magnitude and phase response—shown in FIG. 4—indicate the phase margin of the system. Ideally, the phase margin approaches 45°, providing a loop with adequate stability while minimizing acquisition time.

The closed-loop response of the system is simply $$T(s) = \frac{NK_{PD}K_{VCO}(sR_1C_1 + 1)}{s^2 NR_1C_1C_2 + s[N(C_1 + C_2) + K_{PD}K_{VCO}R_1C_1] + K_{PD}K_{VCO}}$$

which shows the zero and two complex poles. Not surprisingly, both the open-loop and closed-loop responses of the phase-locked loop depend on the integration filter components ($R_1$, $C_1$-$C_2$), the charge pump current $I_{CP}$, and the gain of the voltage-controlled oscillator, $K_{vco}$. Mapping the denominator of the above expression to the characteristic equation of a second order system reveals $$s^2 NR_1C_1C_2 + s[N(C_1+C_2)+K_{PD}K_{VCO}R_1C] + K_{PD}K_{VCO} = s^2 + 2\zeta\omega_n s + \omega_n^2$$

with the critical frequency $\omega_n$ equal to $$\omega_n = \sqrt{\frac{K_{PD}K_{VCO}}{NR_1C_1C_2}}$$

and the damping factor $\zeta$ given by $$\zeta = \frac{1}{\omega_n} \frac{N(C_1 + C_2) + K_{PD}K_{VCO}R_1C_1}{NR_1C_1C_2}$$

Note that the damping factor is usually set to 0.707—the condition for critical damping and 45° phase margin.

The step response of the PLL second order system in essence determines the acquisition time $t_{acq}$ of the frequency synthesizer. As such, it depends on the above PLL parameters ($\omega_n$ and $\zeta$) as well as the programmed step size ($\Delta f$) and required settling accuracy ($\alpha$), with $$t_{acq} \approx \frac{1}{\omega_n} \ln \frac{\Delta f}{f_{VCO} \alpha \sqrt{1 - \zeta^2}}$$

where $f_{VCO}$ is the initial frequency. From this relationship, it is clear that the critical frequency $\omega_n$ sets the PLL's settling time. It follows then that to reduce settling time, the critical frequency must be increased. This can be accomplished by increasing the charge pump current $i_{CP}$, reducing the $R_1C_1$ product, reducing N, or any combination thereof.

Figure 5B:
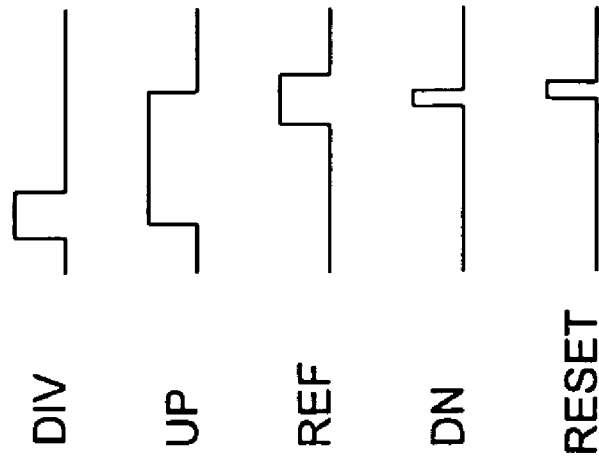
FIGS. 5a and 5b illustrate respectively the phase/frequency detector and an associated timing diagram.
Figure 5A:
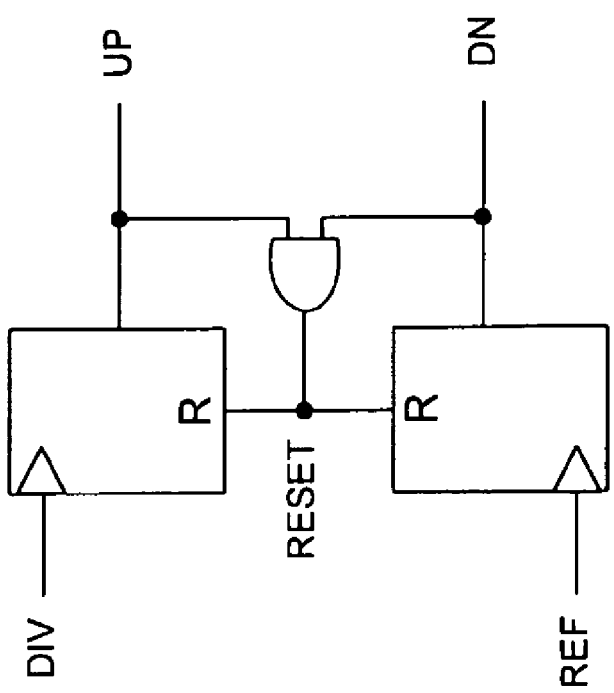

The step response of the phase-locked loop and the corresponding switching behavior are both dynamic and discrete. This is primarily due to the phase/frequency detector. It compares the reference signal REF and divider output signal DIV. The phase/frequency detector operates on the leading edges of these signals to generate an output signal proportional to their phase difference $\Delta\theta$. This is accomplished with a simple digital circuit such as the one shown in FIG. 5a. The circuit consists of two edge-triggered flip-flops and an AND gate. The first leading edge applied to the phase/frequency detector drives its associated flip-flop's output HI. This output remains at this level until the leading edge of the opposite signal drives the other flip-flop HI. At this point, the AND gate resets both flip-flops as shown in FIG. 5b. Note that the non-zero propagation delay of the AND gate causes both outputs to remain HI for a short period, which helps avoid dead zone issues that plague other phase/frequency detectors. It follows that the UP and DN signals indicate which leading edge occurred first while the width of the output signal corresponds to the timing and consequently the phase difference between the REF and DIV signals.

Figure 6:
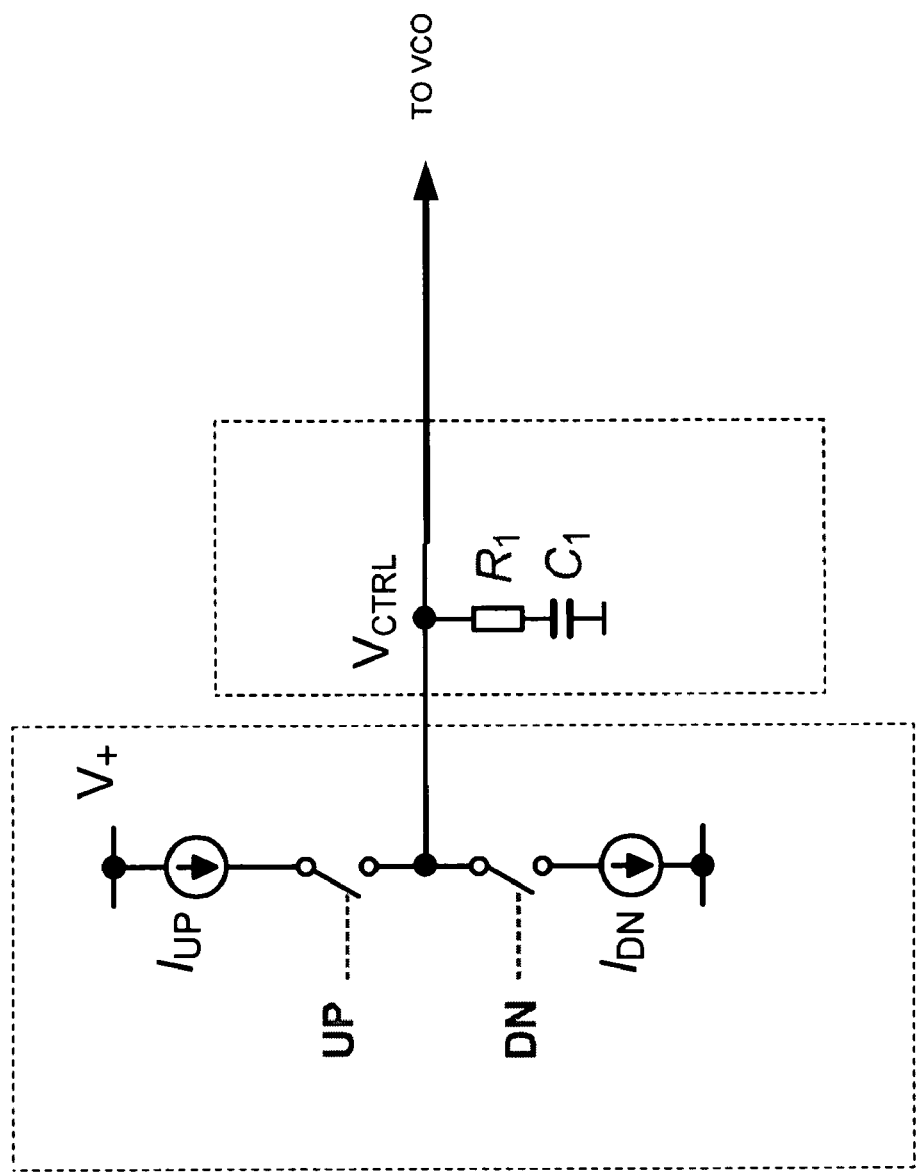
FIG. 6 shows a diagram of a simple charge pump circuit and integration filter.

The UP and DN pulses drive the charge pump circuit and feed the integration filter shown in FIG. 6. The charge pump operates in one of four states—pump up, pump down, tristate, and off—related to the UP and DN signals produced by the phase/frequency detector. An active UP signal directs the charge pump to source charge to the integration filter and increase or pump up the control voltage $v_{ctrl}$. An active DN signal sinks charge from the integration filter and decreases or pumps down the control voltage $v_{ctrl}$. When both the UP and DN signals are active, the charge pump is tristate. Lastly, with neither phase/frequency detector output active, the charge pump is off.

The charge pump sources or sinks charge ($i_{CP}\Delta t$) to or from the integration filter. The charge tends to be discrete and aligns with the UP and DN pulses produced by the phase/frequency detector. By design, these pulses disturb the control voltage $v_{ctrl}$.

It is important that the output of the integration filter $v_{ctrl}$ be well behaved—especially in track mode. This is because transient signals affect the output phase of the VCO and can potentially unlock the phase-locked loop. If this occurs, the phase-locked loop will be forced back to acquisition mode. And, this unfortunately increases the PLL switching time.

Figure 7:
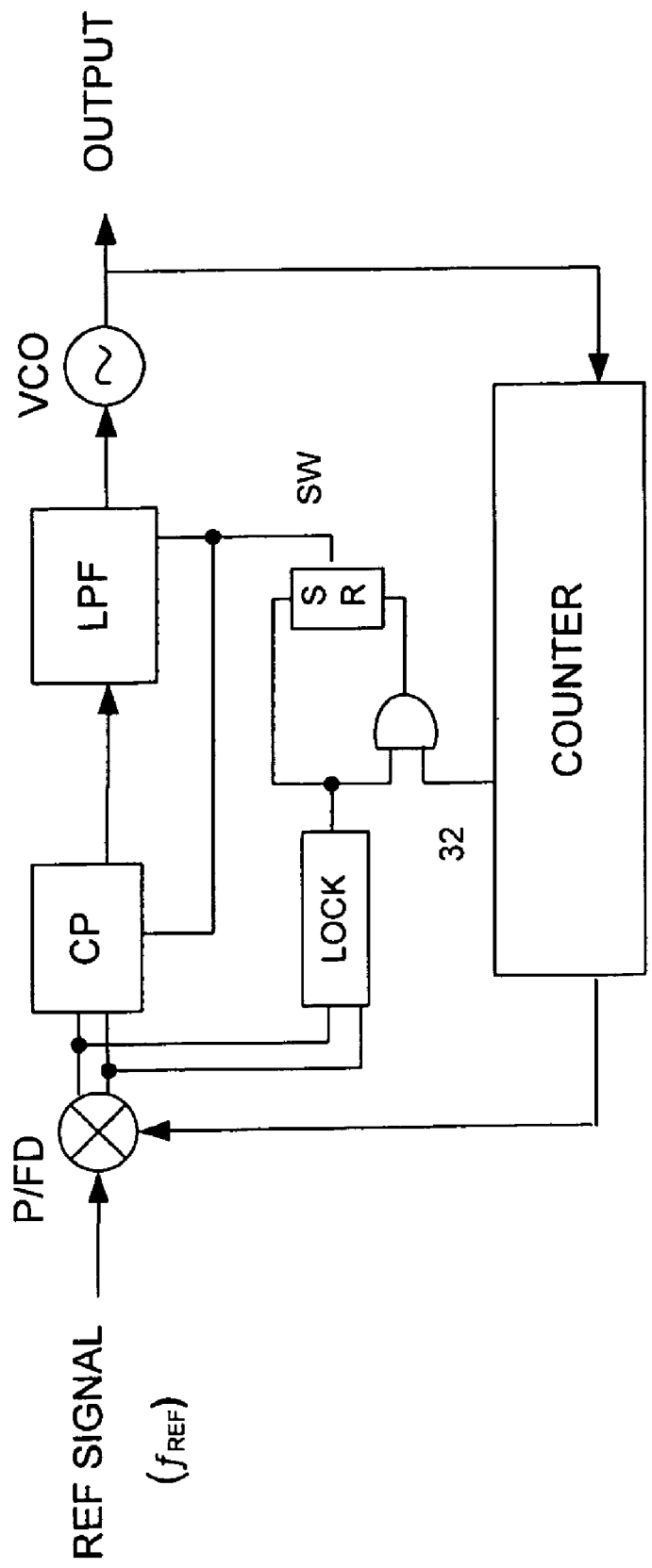
FIG. 7 shows a diagram of a standard PLL which has been modified to optimally switch key parameters in accordance with the present invention.

The inventive system shown in FIG. 7 reduces PLL acquisition time by advantageously and timely switching key parameters of the PLL as it approaches phase-lock. The system amends the standard PLL with a novel lock detect circuit, a decoder, and means to switch key parameters of the PLL.

Figure 8A:
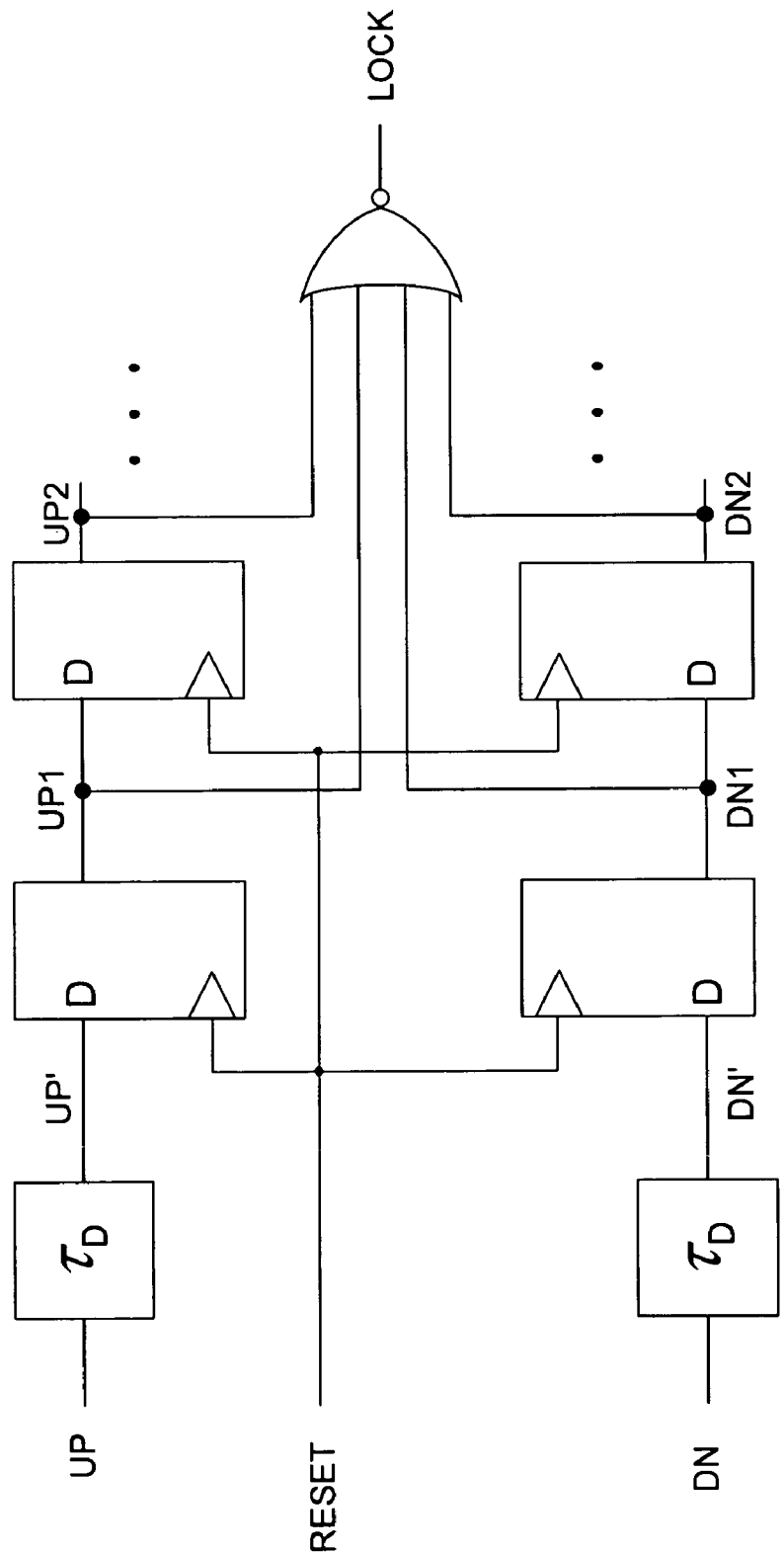
FIGS. 8a and 8b illustrate respectively a detailed diagram of the lock-detect circuit loop in accordance with the present invention and an associated timing diagram.

The lock-detect circuit shown in FIG. 8a monitors the charge pump signals to indicate when the phase-locked loop moves from acquisition mode to track mode. In lock mode, the UP and DN signals become increasingly narrow. In fact, they begin to resemble the RESET signal generated by the phase/frequency detector. It is this behavior that is used to detect phase lock.

Figure 8B:
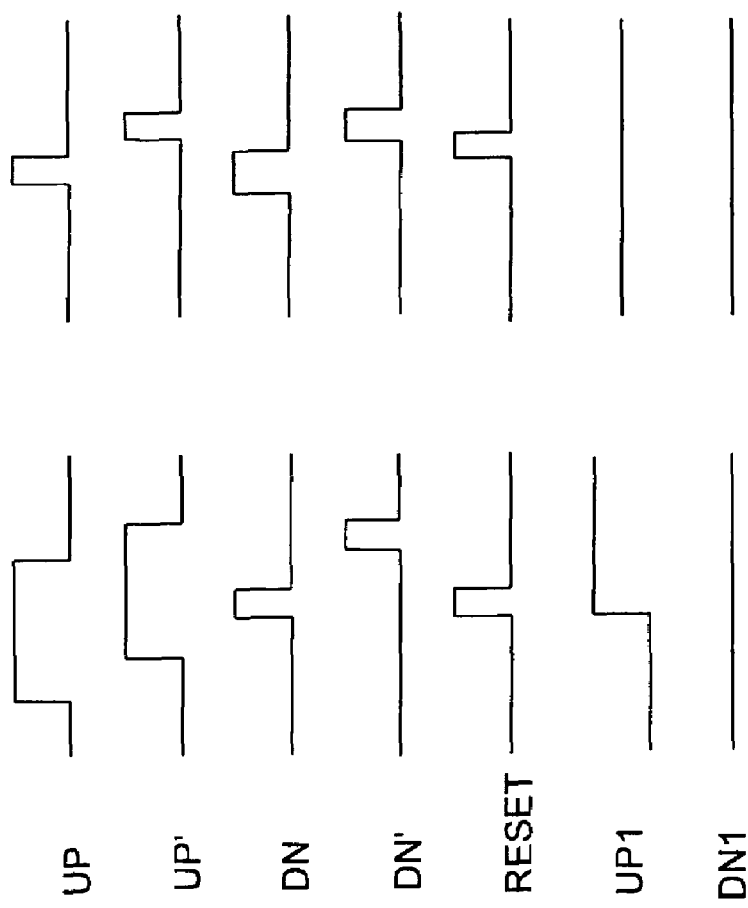

Recall that the RESET pulse toggles the UP and DN signals produced by the phase/frequency detector to logic LO. As such, its rising edge occurs just before (and almost coincident with) the falling edges of these signals. However, to operate properly, the RESET signal must actually trigger the lock detect circuit at an earlier time—a time equal to the minimum pulsewidth for phase-lock $t_{PW}$. In this way, the flip-flops of the phase/frequency detector can store the state of the charge pump at time $t_{RESET}-t_{PW}$ and can thereby capture any pulses wider than $t_{PW}$. In practice, this is implemented instead by delaying the UP and DN signals. This is shown in the timing diagram of FIG. 8b.

Note that it's also possible to use the REF and DIV signals instead of the UP and DN charge pump pulses in the lock detector. Although this requires a longer delay to the trigger signal (to cover the flip-flop delay in the phase/frequency detector), it may prove easier to implement.

The lock detect circuit examines sequential charge pump pulses until it identifies L consecutive pulses narrower than $t_{PW}$. When this occurs, the lock detector generates a LOCK signal. A practical value of L is four.

The phase/frequency detector provides two outputs, which map to four states: UP, DN, reset, and tri-state. UP and DN are fairly obvious. Reset occurs when both UP and DN are active, while tri-state corresponds to when these signals are inactive. In practice, the phase/frequency detector is usually tri-state right up to the leading edges of the REF and DIV signals. In fact, it is usually tri-state much of the time when the phase-locked loop is locked. Furthermore, the leading edges that trigger the phase/frequency detector occur at the zero value of the counters and produce narrow charge pump pulses. As a result, the phase/frequency detector should be tri-state at small, non-zero counter values—for example a counter value of 32. The decoder within the PLL system senses this state of the counter.

The PLL system recognizes the lock detect state and counter value 32 to trigger the signal SW of FIG. 7. This is accomplished by the AND gate and SR flip-flop. A logic LO lock detect signal (indicating the PLL is not phase-locked) forces the SR flip-flop to logic level HI. This corresponds to the set of PLL parameters that provide for fast acquisition. It remains at this state until both lock detect and counter value 32 occur, which in turn resets the SR flip-flop to logic level LO. This condition switches the PLL parameters to a set optimized for low phase noise. Note that if the PLL loses phase-lock, the SR flip-flop sets again to logic HI.

Figure 9:
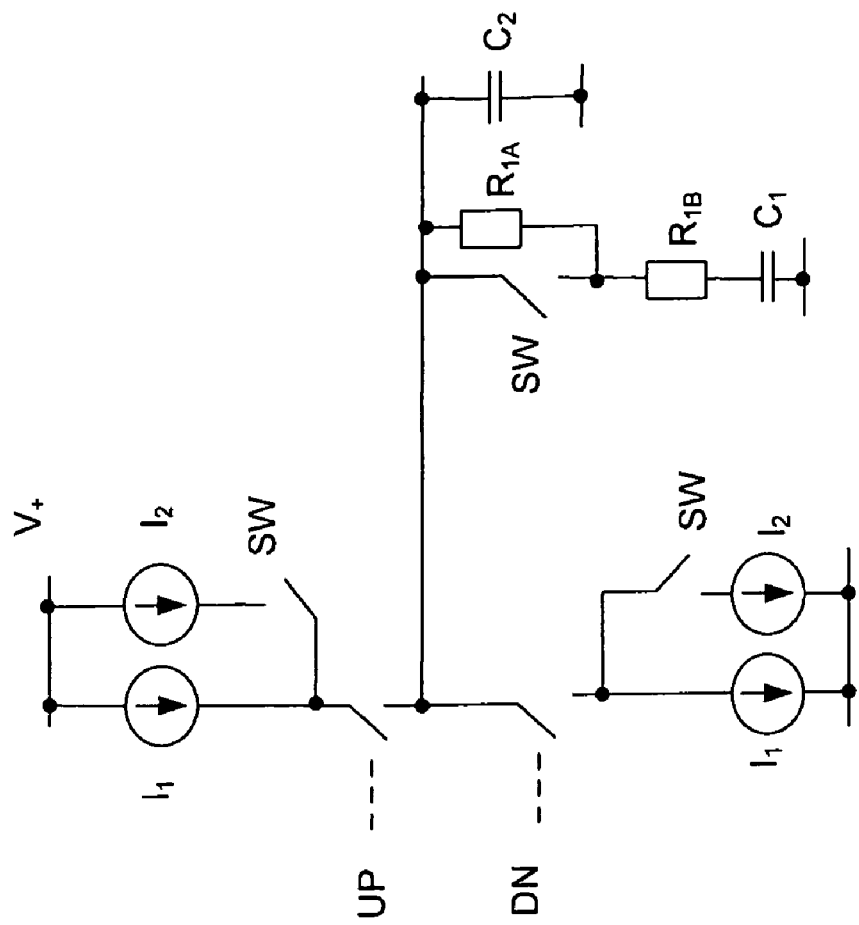
FIG. 9 shows a PLL parameter switch network in accordance with the present invention.

The SW signal directs the circuit of FIG. 9 to switch key parameters (charge pump current $i_{CP}$ and resistor $R_1$ of the integration filter) of the PLL. The logic HI level closes the three switches and sets the following PLL parameters $i_{CP}=I_1+I_2$ and $R_1=R_{1B}$ The larger charge pump current $i_{CP}$ and the lower value of $R_1$ increase the loop bandwidth of the PLL and thereby reduce its acquisition time. After lock detect, the SW signal toggles (at counter value 32) to the logic LO level. This opens the three switches and resets the PLL parameters $i_{CP}=I_1$ and $R_1=R_{1A}+R_{1B}$ to achieve minimum phase noise.

Figure 10A:
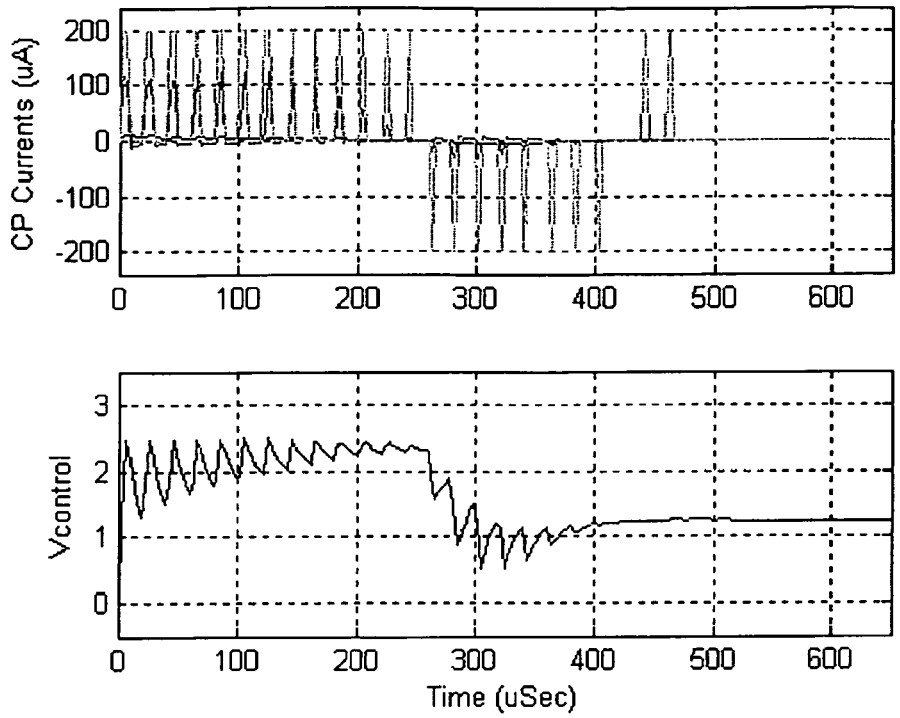
FIG. 10*a* and 10*b* illustrate respectively the time response of a PLL with set and switched parameters.
Figure 10B:
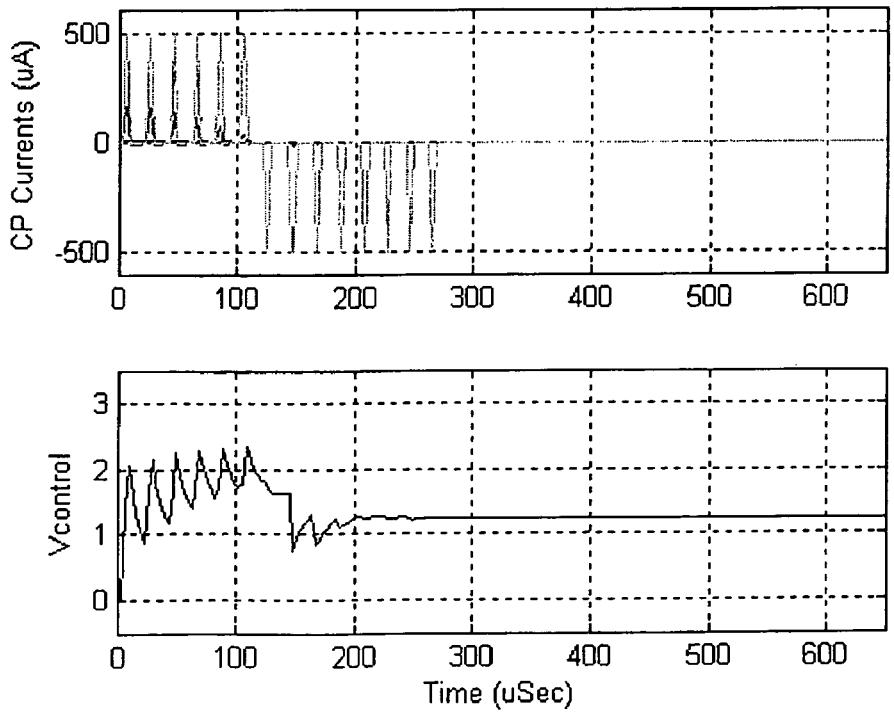

FIG. 10 illustrates the PLL settling response with set parameters and with parameters switched using the inventive network of FIG. 7. The acquisition time is almost halved by switching the PLL parameters.

The foregoing description, for purposes of explanation, used specific nomenclature to provide a thorough understanding of the invention. However, it will be apparent to one skilled in the art that the specific details are not required in order to practice the invention. In other instances, well-known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the following Claims and their equivalents define the scope of the invention.

What is claimed is:

1. A phase-locked loop frequency synthesizer comprising:
   a phase-locked loop, including a charge pump and an integration filter, disposed to function in a first mode and in a second mode;
   a mode detection circuit for generating a first detection signal to initiate transition of the phase-locked loop from the first mode to the second mode; and
   a switching network for changing, at least in part in response to the first detection signal, the values of a first operating parameter and a second operating parameter of the phase-locked loop, said first operating parameter associated with the charge pump and said second operating parameter associated with the integration filter; wherein a divider circuit comprises an N counter and the switching network switches the values of the operating parameters subsequent to generation of the first detection signal and upon the N counter registering a predefined count value.

2. The frequency synthesizer of claim 1 wherein the first mode corresponds to an acquisition mode of operation and the second mode corresponds to a track mode of operation.

3. The frequency synthesizer of claim 1 wherein the mode detection circuit is further operative to generate a second detection signal that changes the phase-locked loop into the second mode and wherein the switching network switches, in response to the second detection signal, the values of the first and second operating parameters from a first state to a second state.

4. The frequency synthesizer of claim 1 wherein the phased-lock loop includes:
   a voltage-controlled oscillator for generating an output signal of a frequency determined by a control voltage;
   a divider circuit for dividing the output signal to produce a frequency-divided signal; and
   a phase/frequency detector disposed to compare phases between an input reference signal and the frequency-divided signal and to produce a first phase error signal and a second phase error signal; wherein the charge pump circuit produces a charge pump signal in response to the first phase error signal and the second phase error signal and the integration filter produces the control voltage in response to the charge pump signal.

5. The frequency synthesizer of claim 4 wherein the mode detection circuit is connected to the phase/frequency detector and is responsive to the first phase error signal and the second phase error signal.

6. The frequency synthesizer of claim 5 wherein the mode detection circuit generates the first detection signal upon determining that a predefined number of sequential pulses of less than a minimum duration are included in the first phase error signal or the second phase error signal.

7. A phase-locked loop frequency synthesizer comprising:
   a phase-locked loop disposed to function in a first mode and in a second mode, said phase locked loop including:
   a voltage-controlled oscillator for generating an output signal of a frequency determined by a control voltage;
   a divider circuit for dividing the output signal to produce a frequency-divided signal;
   a phase/frequency detector disposed to compare phases between an input reference signal and the frequency-divided signal and to produce a first phase error signal and a second phase error signal;
   a charge pump circuit for producing a charge pump signal in response to the first phase error signal and the second phase error signal;
   a loop filter which produces the control voltage in response to the charge pump signal;
   a mode detection circuit for generating a first detection signal to initiate transition of the phase-locked loop from the first mode to the second mode; and
   a switching network for changing, at least in part in response to the first detection signal values of one or more operating parameters of the phase-locked loop; wherein the divider circuit comprises an N counter and the switching network switches the values of the operating parameters subsequent to generation of the first detection signal and upon the N counter registering a predefined count value.

8. The frequency synthesizer of claim 4 wherein the mode detection circuit is responsive to the input reference signal and the frequency-divided signal.

9. A method of operating a phase-locked loop frequency synthesizer, the method comprising:
   defining a first set of operating parameters applicable to operation of a phase-locked loop of the synthesizer in a first mode and a second set of operating parameters applicable to operation of the phase-locked loop in a second mode, said phase-locked loop having a charge pump and an integration filter and said first and said second set of operating parameters each including a first operating parameter associated with the charge pump and a second operating parameter associated with the integration filter;
   generating a first detection signal so as to initiate transition of the phase-locked loop into the second mode; and
   configuring, at least in part in response to the first detection signal, the phase-locked loop to operate in accordance with the second set of operating parameters, wherein said configuring includes switching the value of the second operating parameter of the second set of operating parameters; wherein a divider circuit comprises an N counter and a switching network switches values of the operating parameters subsequent to generation of the first detection signal and upon the N counter registering a predefined count value.

10. The method of claim 9 wherein the first mode corresponds to an acquisition mode of operation and the second mode corresponds to a track mode of operation.

11. The method of claim 9 further including generating a second detection signal to transition the phase-locked loop into operation in the second mode and configuring, at least in part in response to the second detection signal, the phase-locked loop for operation in accordance with the second set of operating parameters.

12. The method of claim 9 wherein the phase-locked loop generates an output signal of a frequency determined by a control voltage, the method further including:
   dividing the output signal to produce a frequency-divided signal;
   comparing phases of an input reference signal and the frequency-divided signal and producing a first phase error signal and a second phase error signal;

producing a charge pump signal in response to the first phase error signal and the second phase error signal; and
generating the control voltage in response to the charge pump signal.

13. The method of claim 12 wherein the first detection signal is generated upon determining that at least a predefined number of pulses of less than a predefined duration are included in the first phase error signal or the second phase error signal.

14. A method of operating a phase-locked loop frequency synthesizer wherein the phase locked loop generates an output signal of a frequency determined by a control voltage, the method comprising:
defining a first set of operating parameters applicable to operation of a phase-locked loop of the synthesizer in a first mode and a second set of operating parameters applicable to operation of the phase-locked loop in a second mode;
generating a first detection signal so as to initiate transition of the phase-locked loop into the second mode; and
configuring, at least in part in response to the first detection signal, the phase-locked loop to operate in accordance with the second set of operating parameters; wherein the phase-locked loop:
divides the output signal to produce a frequency-divided signal, the frequency divided signal being produced using an N counter;
compares phases of an input reference signal and the frequency-divided signal and producing a first phase error signal and a second phase error signal;
produces a charge pump signal in response to the first phase error signal and the second phase error signal; and
generates the control voltage in response to the charge pump signal; and wherein the phase-locked loop is configured to operate in accordance with the second set of operating parameters subsequent to generation of the first detection signal and upon the N counter registering a predefined count value.

15. An apparatus for configuring operational parameters of a phase locked loop, comprising:
a mode detection circuit for generating a first detection signal to transition the phase-locked loop from a first operative mode to a second operative mode; and
a parameter switching network operative to switch, at least in part in response to the first detection signal, values of a first operating parameter associated with a charge pump and a second operating parameter associated with an integration filter of the phase-locked loop from a first state to a second state; wherein a divider circuit comprises an N counter and the switching network switches the values of the operating parameters subsequent to generation of the first detection signal and upon the N counter registering a predefined count value.

16. The apparatus of claim 15 wherein the first operative mode corresponds to an acquisition mode of operation and the second operative mode corresponds to a track mode of operation.

17. The apparatus of claim 15 wherein the mode detection circuit is further operative to generate a second detection signal to transition the phase-locked loop into the second operative mode and wherein the parameter switching network is disposed to switch, at least part in response to the second detection signal, the values of the one or more operating parameters from the first state to the second state.

18. A phase-locked loop module, comprising:
a voltage-controlled oscillator for generating an output signal of a frequency determined by a control voltage;
a divider circuit for dividing the output signal to produce a frequency-divided signal;
a phase/frequency detector disposed to compare phases between an input reference signal and the frequency-divided signal and to produce a first phase error signal and a second phase error signal;
a charge pump circuit for producing a charge pump signal in response to the first phase error signal and the second phase error signal, the charge pump circuit characterized by a first operating parameter;
a loop filter for producing the control voltage in response to the charge pump signal, the loop filter characterized by a second operating parameter; and
a parameter switching arrangement for changing values of the first and second operating parameters subsequent to transition of the phase-locked loop from a first operative mode to a second operative mode; wherein the divider circuit comprises an N counter and the switching arrangement switches the values of the operating parameters subsequent to generation of the first detection signal and upon the N counter registering a predefined count value.

19. The phase-locked loop module of claim 18 wherein the parameter switching arrangement includes a lock detection circuit for generating a lock detection signal to transition the phase-locked loop from the first operative mode to the second operative mode.

20. The phase-locked loop module of claim 18 wherein the first operative mode corresponds to an acquisition mode of operation and the second operative mode corresponds to a track mode of operation.

21. The phase-locked loop module of claim 19 wherein the lock detection circuit is further operative to generate an unlocked detection signal that prevents transition of the phase-locked loop to the second mode.

22. A phase-locked loop frequency synthesizer comprising:
a phase-locked loop disposed to function in a first operative mode and in a second operative mode;
a parameter switching arrangement for switching values of a first operating parameter of the phase-locked loop associated with a charge pump and a second operating parameter of the phase-locked loop associated with a loop filter of the phase-locked loop from a first state to a second state subsequent to transition of the phase-locked loop from the first operative mode into the second operative mode; wherein a divider circuit comprises an N counter and the switching arrangement switches the values of the operating parameters subsequent to generation of the first detection signal and upon the N counter registering a predefined count value.

23. The phase-locked loop frequency synthesizer of claim 22 wherein the parameter switching arrangement includes a mode detection circuit for generating a first detection signal to initiate transition the phase-locked loop from the first operative mode to the second operative mode.

24. The phase-locked loop of claim 1 wherein the first operating parameter is a charge pump current value and the second operating parameter is a loop filter component value.

25. The phase-locked loop of claim 1 wherein the loop filter component value is a resistor value.

26. The method of claim 9 wherein the first operating parameter is a charge pump current value and the second operating parameter is a loop filter component value.

27. The method of claim 26 wherein the loop filter component value is a resistor value.

28. The apparatus of claim 15 wherein the first operating parameter is a charge pump current value and the second operating parameter is a loop filter component value.

29. The apparatus of claim 28 wherein the loop filter component value is a resistor value.

30. The module of claim 18 wherein the first operating parameter is a charge pump current value and the second operating parameter is a loop filter component value.

31. The module of claim 30 wherein the loop filter component value is a resistor value.

32. The synthesizer of claim 22 wherein the first operating parameter is a charge pump current value and the second operating parameter is a loop filter component value.

33. The synthesizer of claim 32 wherein the loop filter component value is a resistor value.

* * * * *